United States Patent [19]
Keller

[11] 3,953,796
[45] Apr. 27, 1976

[54] METHOD AND APPARATUS FOR MEASURING ELECTRICAL CONDUCTIVITY

[75] Inventor: Wolfgang Keller, Munich, Germany

[73] Assignee: Siemens Aktiengesellschaft, Berlin & Munich, Germany

[22] Filed: May 30, 1974

[21] Appl. No.: 474,612

[30] Foreign Application Priority Data
June 5, 1973 Germany............................ 2328590
June 5, 1973 Germany............................ 2328589

[52] U.S. Cl. ........................... 324/158 R; 324/58 C
[51] Int. Cl.² .................. G01R 31/26; G01R 27/02
[58] Field of Search.......... 324/158 D, 62, 40, 58 B, 324/58 C, 158 R

[56] References Cited
UNITED STATES PATENTS

| | | | |
|---|---|---|---|
| 2,859,407 | 11/1958 | Henisch................................. | 324/40 |
| 3,234,461 | 2/1966 | Trent et al........................ | 324/158 D |
| 3,315,156 | 4/1967 | Keller................................ | 324/58 C |
| 3,452,279 | 6/1969 | DiPiazza........................... | 324/58 B |
| 3,805,160 | 4/1974 | Philbrick et al. ................ | 324/158 D |

OTHER PUBLICATIONS
Nalivaiko et al.; "Resonator Method . . . "; Elektron Tekh. 12 (USSR); No. 4 (10); 1971.

Primary Examiner—R. V. Rolinec
Assistant Examiner—Ernest F. Karlsen
Attorney, Agent, or Firm—Hill, Gross, Simpson, Van Santen, Steadman, Chiara & Simpson

[57] ABSTRACT

Method and apparatus for measuring the conductivity of material such as semiconductor discs which are coupled capacitively to a high frequency resonant circuit so as to dampen the circuit. The resonant circuit is designed as a tank circuit of high quality and has an inner conductor and a coaxial outer conductor. An opening is formed in the resonant cavity at the capacitive end and the semiconductor material covers the opening and is capacitively coupled to the cavity. Energy is coupled into the cavity from a driving oscillator and energy is coupled out of the cavity and is detected and indicated on a suitable indicating device. The resistivity of the semiconductor disc can be determined from the input and output energy.

8 Claims, 4 Drawing Figures

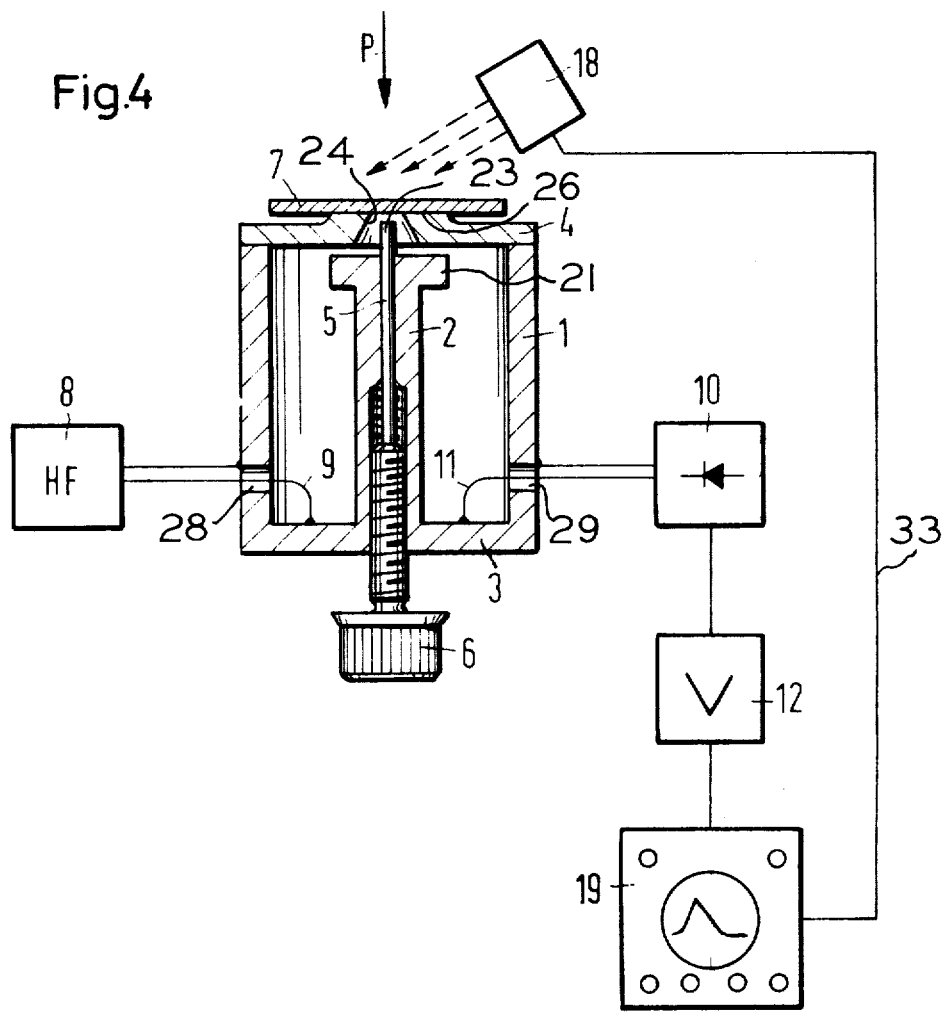

METHOD AND APPARATUS FOR MEASURING ELECTRICAL CONDUCTIVITY

BACKGROUND OF THE INVENTION

1. Field of the Invention

This invention relates in general to a method and apparatus for measuring the resistivity of material such as semiconductor material.

2. Prior Art

Arrangements for measuring the electrical conductivity of material such as semiconductor discs and particularly where the semiconductor disc is coupled capacitively to a resonant circuit which is driven by a high frequency generator so as to dampen the resonant circuit as a function of its conductivity and wherein a voltage measuring device is connected to the resonant circuit so as to determine the conductivity of the semiconductor disc are known. For example, such an arrangement is described in Zeitschrift for angewandte Physik, Volume 23 (1967), Issue 4, pages 268-270. As described in this article, a metal probe with a known probe frontal area is pressed with a thin film of water onto a silicon disc and is then pressed onto a metal plate. The probe is connected electrically with the capacitor of a resonant circuit and is connected through a second circuit via the film of water which acts as a high capacitance electrical connection over the area of the silicon disc which is engaged by the probe frontal area and over the metal plate to the coil of the resonant circuit. Depending upon the conductivity of the electrical effective area of the silicon disc, the resonant circuit will be attenuated. The dependent resonant voltage is measured by a voltage measuring device and serves as a measure of the conductivity of the disc area. In this known system for measuring the local conductivity it is necessary to shift the silicon disc and the electrical effective area which is between the probe frontal area and the metal plate. Shifting of the probe on the surface of the silicon disc will bring the same results if the disc rests firmly on the metal plate. Under certain conditions, however, the variations of the measured voltage correspond to the local conductivity. A proportionality results if on the one hand the resistance of the silicon disc is small in comparison to the resonant resistance of the resonating circuit but on the other hand is large in comparison to the attenuation resistance of the resonating circuit. Thus, the attenuation resistance has to be as small as possible if the utilizable measuring area is desired to be as large as possible.

This, however, implies that the quotient of the resonant blind resistance and the attenuation resistance of the resonant circuit should be as high as possible. However, the requirement for high local disintegration requires for exact measuring the conductivity a decrease of the frontal probe area. This, however, increases the influence of the coupling capacity of the water film on the measuring results. The electrical characteristics of the capacitor formed by the film of water cannot be neglected. Furthermore, since the silicon disc forms a galvanic element through the film of water with the metal probe, the conductivity of the film of water can be easily changed. Also, however, the characteristics of the capacitor formed through the water changes very quickly. Thus, apparatus according to the prior art does not give results which are reproducible and is subject to high local disintegration and of poor quality.

SUMMARY OF THE INVENTION

The present invention provides an advance in the state of the art and increases the local resolution in the measuring of the conductivity of a semiconductor disc and assures good reproducibility of results.

In order to solve the task of this invention, a resonant circuit comprising a cavity of high quality is formed in the form of a coaxial resonator having an inner conductor and an outer conductor. One end of the outer conductor is closed by an electrically conducting end plate and the other end of the outer conductor is connected by an end plate which is formed with a tapered opening. The inner conductor is electrically connected to the end plate of the outer conductor remote from the opening and the other end of the inner conductor is capacitively coupled to the end plate of the outer conductor which is formed with an opening.

A semiconductor plate or disc is mounted so that it covers the hole in the end plate of the outer conductor and it is also capacitively coupled to the inner conductor of the resonant circuit. Since the resonant cavity of the invention has very high quality, the semiconductor disc can be very loosely coupled to it and therefor very small coupling capacitances are sufficient and dielectrics having large dielectric constants are not necessary. An air gap can be used as the coupling medium.

Thus, the disadvantages of the prior art including the problem of reproducing results are eliminated by the present invention.

A preferred embodiment of the invention comprises a resonant cavity comprising a coaxial waveguide with the outer conductor having one end wall covering one end of the outer conductor and a second end wall formed with an opening covering the second end of the outer conductor. The semiconductor disc is placed over the opening in the second end wall and the disc is capacitively coupled in the inner conductor of the resonant cavity. The end of the inner conductor adjacent the opening in the second end wall can be enlarged to obtain improved results.

A further improved advantage of the invention lies in the fact that a coaxial probe is mounted inside the inner conductor and is adjustable by a lead screw and knob so as to vary the distance from the inner conductor to the semiconductor disc thus allowing the capacitive coupling of the tank circuit to be adjusted to the semiconductor disc.

A further advantageous development of the invention utilizes the above described arrangement so as to determine the local course of the duration of the carrier in the semiconductor disc. An arrangement for contactless measuring of the duration of a carrier in silicon single crystals is known and is described in Zeitschrift fur angewandte Physik, Volume 11 (1959, Issue 9, pages 351 and 352), whereby the carrier which is to be examined is subjected to short-time flashes of light. These flashes create carrier pairs in silicon which in turn influence the conductivity of the silicon. The carrier pairs, however, recombine after each flash light pulse so that the concentration of carrier pairs decreases as a function of time. The conductivity decreases in the same fashion. By measuring the time variation of the conductivity the duration of carriers can be determined on an oscilloscope. The present invention allows the duration of carriers to be measured with considerably higher local resolution than would be possible with known prior art arrangements.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure, and in which:

BRIEF DESCRIPTION OF THE DRAWINGS

FIG. 4 is a sectional view of the invention illustrating its use for measuring the duration of carriers.

DESCRIPTION OF THE PREFERRED EMBODIMENTS

Figure 1:
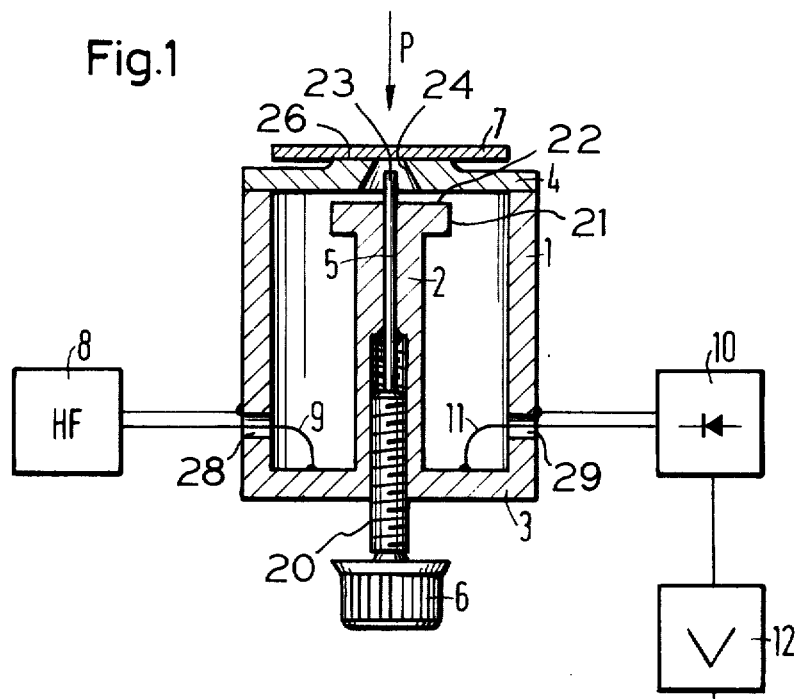
FIG. 1 is a sectional view of an embodiment of the invention.

FIG. 1 is a sectional view through a resonant cavity comprising an outer cylindrical conductor 1 which has its inner surface silver-plated and polished. A first end plate 3 closes one end of the outer conductor 1 and a second end plate 4 closes the second end of the outer conductor 1. The end plate 4 is formed with a tapered opening 24 and its outer surface has a planar surface 26 upon which a test specimen 7 of silicon or other material can be placed for measuring purposes. An inner conductor 2 has one end attached to the end plate 3 centrally of the inner conductor 1 and its second end terminates adjacent the end plate 4 in alignment with the opening 24. The portion of the inner conductor 2 adjacent the end plate 4 is enlarged to form the portion 21. Mounted within and extending from the inner conductor 2 is a capacitive probe 5 which has its end 23 extending into the opening 24 adjacent the plate 7. The capacitive probe 5 can be adjusted axially of the inner conductor 2 by the knob 6 and the lead screw 20 which is threadably received in a mating opening in the inner conductor 2. A silicon disc 7 may be mounted on the surface 26 over the opening 24 with a suitable clamp or spring pressure which is symbolically denoted by the vector P which presses the disc 7 against the surface 26.

The annular-shaped surface 26 upon which the disc 7 is mounted provides an increased surface for supporting the disc 7 and thus substantially reduces the surface irregularity upon which the disc 7 rests.

A high frequency generator 8 is coupled through an opening 28 in the side wall of the outer conductor 1 with a inductive loop 9 which has its inner end connected to the end plate 3. An output loop 11 is connected to the end plate 3 on the other side of the inner conductor 2 and extends through a window 29 and is connected to a rectifier 10 which supplies an output to an amplifier which is in turn connected to an indicating instrument 13. The amplifier is designated 12.

In operation, the silicon disc 7 is placed on the surface 26 over the opening 24 and energy is supplied by the high frequency oscillator 8 into the cavity. Output energy is coupled from the loop 11 and the indicator 13 varies as a function of the resistivity of the disc 7.

Figure 2:
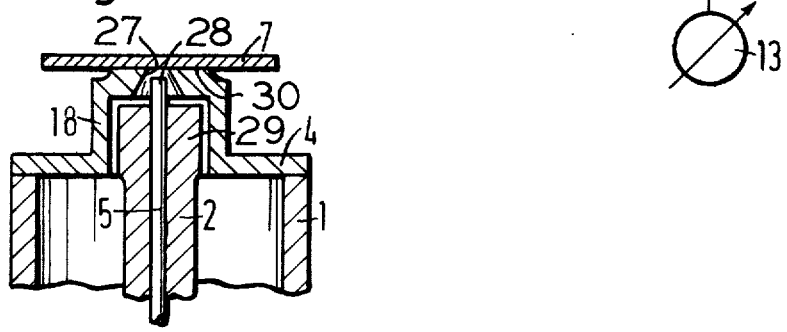
FIG. 2 is an enlarged sectional view of a modification of the invention.

FIG. 2 illustrates a modification of the invention wherein the end wall 4 is formed with an extending smaller cylindrical portion 18 in which the end portion 29 of the inner conductor 2 extends. The tapered opening 27 receives the plate 7 over its smaller end and on the bearing surface 30. The probe 5 has an end 28 which extends into the tapered opening 27. The embodiment of FIG. 2 provides for a cylindrical capacity which is insensitive to temperature variations between the inside and outside of the cavity.

Figure 3:
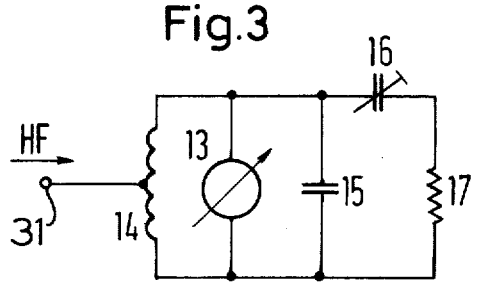
FIG. 3 is a schematic diagram of the invention.

In the schematic diagram of FIG. 3, the inductance of the cavity is illustrated by the coil 14 and the output of the high frequency oscillator 8 is connected to an input terminal 31 which is tapped to the coil 14. The indicating instrument 13 is connected across the output of the coil 14. A capacitor 15 is connected in parallel with the indicator 13 and the coil 14. A resistor 17 and variable capacitor 16 are connected in series and connected in parallel with the capacitor 15, the indicator 13 and the coil 14. The variable capacitor 16 represents the coupling capacity of the probe 5 to the silicon disc 7. The resistor 17 represents the effective resistance of the area of the silicon disc between the coupling point of the probe 5 and the supporting surface 26. The cavity which forms a tank circuit can be adjusted to resonate by either adjusting the frequency of the high frequency generator 8 or by adjusting the capacity of coupling by turning the knob 6. Of course, both may be simultaneously or alternately adjusted if desired. The adjustments are made until resonance occurs. When the silicon disc 7 is moved, another effective area couples with the tank circuit and if the new area has a different conductivity from the old area, the two areas will attenuate the tank circuit differently. These differences are reflected in the resonant voltage which can be read at the indicator instrument.

Thus, with the arrangement according to the invention, including the tank circuit with a silver-plated and polished on the inside, which increases the quality and accuracy, the conductivity of the semiconductor disc over its entire area can be obtained with a much greater degree of resolution than is possible with the prior art. This is possible because of the high quality which can be achieved with a tank circuit with a relatively high frequency as is required if semiconductor discs of 0.3 to 3 mm thickness and having resistance between 5 to 300 ohms cm specific resistivity with a measuring probe diameter of 0.5 to 1 mm are to be measured. In the case of an actually constructed device for 160 MHz, a quality of 5000 has been achieved.

Also, with an arrangement according to the invention, semiconductor discs consisting of polycrystalline semiconductor material can be measured.

The apparatus illustrated in FIG. 4 is useful for determining the time duration of carriers in a semiconductor disc. The semiconductor is subjected to short-time flashes of light and these flashes create carrier pairs in the silicon which in turn influence the conductivity of the silicon. However, the carrier pairs recombine after the light pulses have terminated so that the concentration of the carrier pairs decrease as a function of time. This decrease also effects the conductivity. Thus, by measuring the time variation of the conductivity, the duration of carriers can be determined with an oscilloscope, for example. The apparatus of FIG. 4 is useful for this purpose. The structure of the cavity and its driving and output means are the same as in FIG. 1 with the exception that an oscilloscope 19 receives the output of the amplifier 12 and provides a trace as a function of time so as to show the variation of the resistance as a function of time. A light source 18 provides intermittent flashes of light which have a steep flank on their trailing edge so as to give an accurate time reference when the light was turned off. A synchronizing lead 33 extends from the light source 18 to the oscilloscope 19 to synchronize the oscilloscope and the light source 18. The trace of the oscilloscope 19 will illustrate as a function of time the variation in resistance which is indicative of the duration of carriers which were produced by the light excitement from the light source 18. The decay of carriers follows an approximately exponential curve. If the duration of carriers changes, this may immediately be observed from the oscilloscope 19. By constantly shifting the areas of the disc 7 over the opening 24, the life time of the carriers may be illustrated for all portions of the disc 7.

It is seen that this invention provides new and novel apparatus and methods for measuring the resistivity and the life time of carriers and materials and although it has been described with respect to preferred embodiments, it is not to be so limited as changes and modifications may be made which are within the full intended scope as defined by the appended claims.

I claim as my invention:

1. An arrangement for measuring of the local variation of the electrical conductivity of a semiconductor planar member such as a silicon disc without destroying it comprising, a resonant circuit, a high frequency generator connected to excite said resonant circuit, a portion of the area of the semiconductor member which is to be measured capacitively coupled to said resonant circuit so as to attenuate the energy in the resonant circuit as a function of its resistivity, a voltage measuring device coupled to said resonant circuit to measure the resonance voltage of the resonant circuit which serves as measurement of the conductivity of the coupled portion of the area of the semiconductor, and wherein said resonant circuit consists of a tank circuit of high quality in the form of a coaxial resonator with an inner conductor and closed off outer conductor and whereby said inner conductor has one end electrically connected to a first cover of said outer conductor and its other end capacitively coupled to a second cover of said outer conductor, an opening formed in said second cover having a smaller size than said semiconductor member, said semiconductor member mounted on said second cover over said opening and coupled to said resonant circuit through said opening formed in said second cover and said semiconductor member pressure supported over said opening, and a coaxial probe mounted in said inner conductor of said resonant circuit with one end which extends from said other end of said inner conductor to capacitively couple said other end of the inner conductor and said one end of said probe to said semiconductor member and said probe is shiftable axially of said inner conductor and relative to said opening in said second cover, whereby the capacitive coupling of said resonant circuit with the coupled area of said semiconductor member can be adjusted.

2. An arrangement according to claim 1, wherein said second capacitive closing cover of said resonant circuit has a concentric cylinder-shaped portion that extends away from said first cover and said other end of said inner conductor extends into said cylinder-shaped portion and forms a cylindrical capacitor.

3. An arrangement according to claim 1, wherein said second lid of said resonant circuit has an annular planar portion which surrounds said opening such that as said semiconductor member is shifted it maintains good contact with said annular planar portion.

4. An arrangement according to claim 1, wherein said coaxial probe is threaded into said inner conductor of said resonant circuit and can be shifted by turning its second end which extends from said first cover externally of said resonant circuit.

5. An arrangement according to claim 1, wherein said second end of said inner conductor of the resonant circuit is enlarged to form a capacitive member thereon.

6. An arrangement according to claim 1, wherein said measuring device comprises an oscilloscope and a flashing light source mounted to periodically illuminate said semiconductor member with light flashes such that by the indications of the time variations of the resonance voltage indicated by the oscilloscope the duration of the carriers formed in said semiconductor member can be measured.

7. An arrangement according to claim 6, including an electrical synchronizing connection between said oscilloscope and said flashing light source such that the time variations of resistance can be measured.

8. The arrangement according to claim 7, wherein said flashing light source produces light flashes having steep trailing edges so as to improve accuracy of the carrier life times.

* * * * *